(12) United States Patent
Gründl et al.

(10) Patent No.: US 7,760,480 B2
(45) Date of Patent: Jul. 20, 2010

(54) ELECTRONIC ASSEMBLY FOR SWITCHING ELECTRIC POWER

(75) Inventors: Andreas Gründl, München (DE); Bernhard Hoffmann, Starnberg (DE)

(73) Assignee: Compact Dynamics GmbH, Starnburg (DE)

( * ) Notice: Subject to any disclaimer, the term of this patent is extended or adjusted under 35 U.S.C. 154(b) by 1125 days.

(21) Appl. No.: 10/559,755

(22) PCT Filed: Jun. 11, 2004

(86) PCT No.: PCT/EP2004/006322

§ 371 (c)(1), (2), (4) Date: Apr. 21, 2006

(87) PCT Pub. No.: WO2004/110123

PCT Pub. Date: Dec. 16, 2004

(65) Prior Publication Data

US 2006/0209494 A1 Sep. 21, 2006

(30) Foreign Application Priority Data

Jun. 11, 2003 (DE) .............................. 103 26 321

(51) Int. Cl.
*H02H 3/00* (2006.01)
(52) U.S. Cl. ..................................... 361/100
(58) Field of Classification Search ................ 361/319, 361/100; 307/113, 137; 73/146
See application file for complete search history.

(56) References Cited

U.S. PATENT DOCUMENTS

| | | | | |
|---|---|---|---|---|
| 4,816,984 A | * | 3/1989 | Porst et al. ............... | 363/56.02 |
| 5,142,439 A | * | 8/1992 | Huggett et al. ........... | 361/321.2 |
| 5,493,472 A | * | 2/1996 | Lavene ...................... | 361/329 |
| 5,671,134 A | * | 9/1997 | Nomura et al. ............. | 363/132 |
| 6,160,696 A | * | 12/2000 | Bailey et al. ................ | 361/115 |
| 6,249,448 B1 | * | 6/2001 | Regnier et al. ............. | 363/144 |
| 6,683,418 B2 | * | 1/2004 | Shoji et al. .................. | 315/224 |
| 7,122,890 B2 | * | 10/2006 | Grant .......................... | 257/698 |

(Continued)

FOREIGN PATENT DOCUMENTS

DE 4027969 C1 11/1991

(Continued)

OTHER PUBLICATIONS

Forms PCT/ISA/210 and 220 International Search Report for PCT/EP2004/O06322, Oct. 25, 2004.

*Primary Examiner*—Adolf Berhane
*Assistant Examiner*—Yemane Mehari
(74) *Attorney, Agent, or Firm*—Wood, Herron & Evans, LLP

(57) ABSTRACT

An electronic assembly for switching electric power, comprising two power supply buses spaced from each other between which semiconductor switches to be driven by means of a control input are arranged at a power output for providing electric power, a capacitor arrangement bridging the two power supply buses, which extends at least partially over the length of the power supply buses, two contact layers originating from one each of the power supply buses and covering the capacitor arrangement at least partially, with the contact layers comprising free end portions which mutually project one another towards the respective other one of the power supply buses, and with the two contact layers having a freely accessible contact area each which is adapted for contact making with correspondingly configured power terminals.

12 Claims, 4 Drawing Sheets

U.S. PATENT DOCUMENTS 7,148,660 B2 * 12/2006 Ghosh et al. ................ 323/207
2006/0209494 A1 * 9/2006 Grundl et al. ............... 361/319

FOREIGN PATENT DOCUMENTS

| | | |
|---|---|---|
| DE | 4230510 C1 | 9/1993 |
| DE | 19826731 A1 | 12/1999 |
| DE | 19846156 C1 | 7/2000 |
| EP | 0379346 A2 | 7/1990 |
| EP | 0417747 A2 | 3/1991 |
| EP | 0987761 A2 | 3/2000 |

* cited by examiner

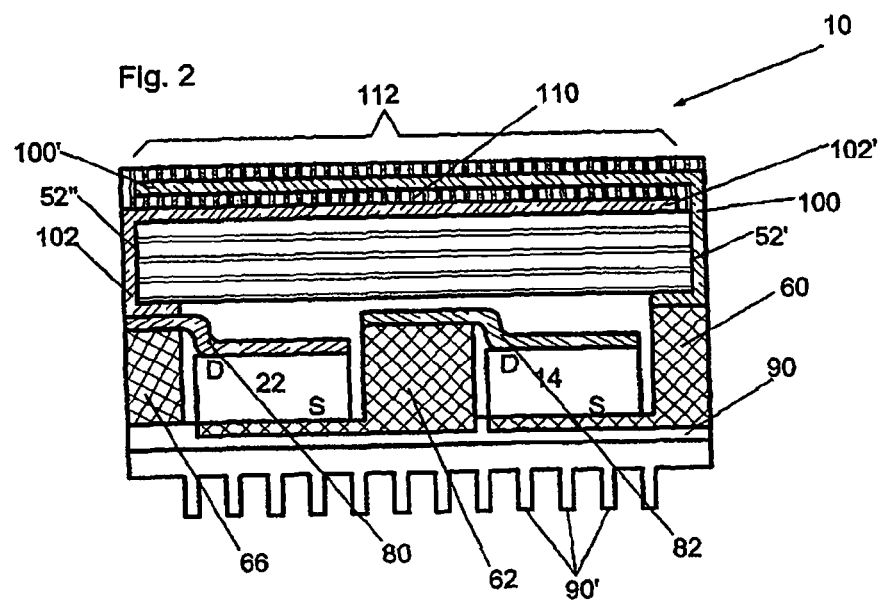
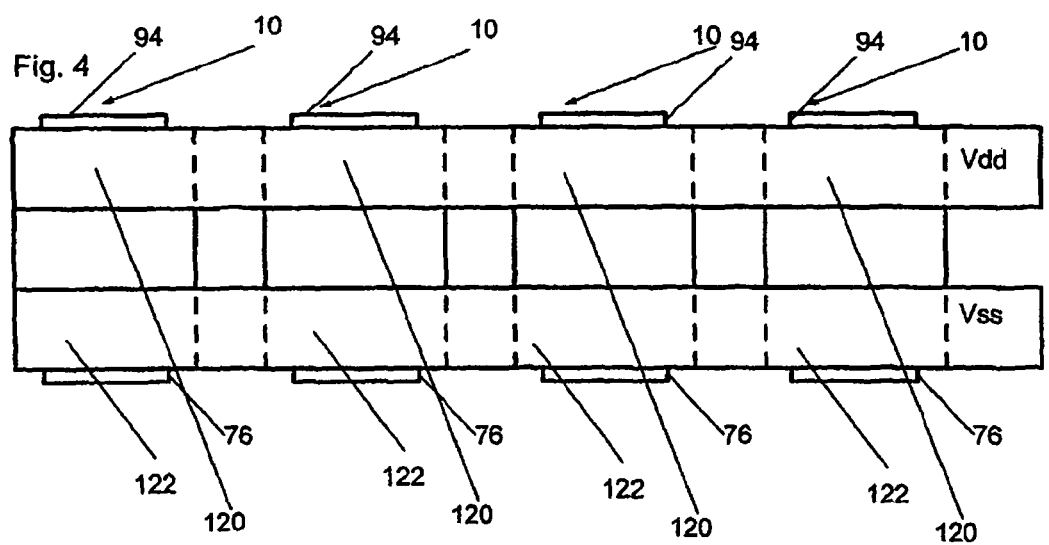

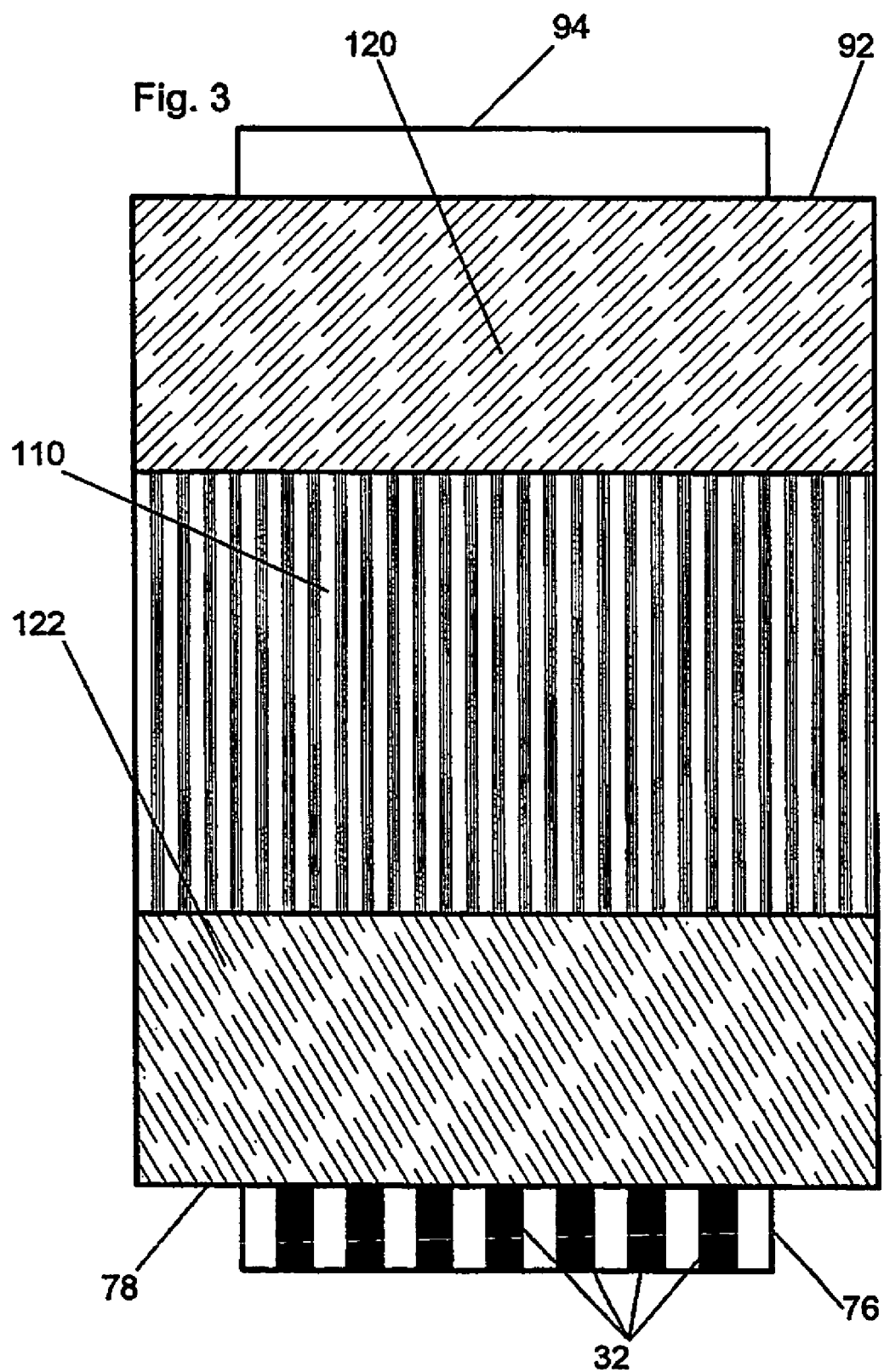

ELECTRONIC ASSEMBLY FOR SWITCHING ELECTRIC POWER

BACKGROUND OF THE INVENTION

The invention relates to an electronic assembly for switching electric power. Such electronic assemblies may, for example, be designed as half-bridge circuit to be employed for the realisation of inverters or frequency converters in the most different fields of application. This includes the operation of synchronous machines, asynchronous machines, reluctance machines, permanent field machines, or the like, as well as motors and generators (see e.g. DE-A-40 27 969 or DE-A-42 30 510).

State of the Art

In the state of the art it is known to operate electrical machines, in particular alternating field machines, with so-called frequency converters. Generally, these frequency converters include half-bridge arrangements whose number corresponds to the number of phases of the electrical machine, which are supplied with control signals from a control electronics circuit. Depending on whether the electrical machine is operated as a motor or a generator, the electric power is supplied to the electrical machine either for the desired speed or the desired torque, or the electric power is taken from the electrical machine and converted into the desired amount and phase position.

In particular with high-speed switching frequency converters or inverters, high overshoot or undershoot glitch voltage peaks occur at the switching edges of the supplied or withdrawn electric power. Because of the occurring overvoltage glitches, the dielectric strength of the semiconductor switches employed in the electronic assembly has to be considerably higher than their operating dielectric strength. This increases the costs of the assembly significantly.

Problem on which the Invention is Based

The invention is therefore based on the problem to provide an electronic assembly for switching electric power which may be manufactured economically and is of compact construction so that it may also be employed for mobile applications (e.g. in the automotive field).

Inventive Solution

For the solution the invention provides an electronic assembly for switching electric power, comprising two spaced power supply buses between which semiconductor switches for providing the electric power, which are to be driven by means of a control input, are arranged at a power output. A capacitor arrangement which bridges the two power supply buses extends at least partially over the length of the power supply buses. Two contact layers originating from one each of the power supply buses, which at least partially cover the capacitor arrangement, comprise free end portions which mutually project one another towards the respective other one of the power supply buses. The two contact layers have a freely accessible contact area each which is adapted for contact making with correspondingly configured power terminals.

Inventive Advantages and Embodiments

Through the inventive construction of the electronic assembly a particularly compact arrangement is achieved which enables a packing density which is not comparable with the previous solutions. Moreover, voltage pulse peaks even in switching with pulse durations ranging from 10 to 1000 ns and high switching capacities in the range of several tens Watts up to several kilowatts are significantly minimised. This results in a significantly increased interference immunity. The power carrying lines to/from the semiconductor switches of the capacitor arrangements acting as a back-up capacitor of the inventive arrangement are of a very low inductance. Another important aspect of the invention is the modular construction which allows an uncomplicated extension and adaptation of the electronic assembly to the respective requirements.

Due to the fact that the capacitor arrangement is positioned spatially and electrically very close to the contact areas, on the one hand, and, on the other hand, spatially and electrically very close to the semiconductor switches, there are no line portions which would cause considerable interfering inductive portions. This allows the realisation of very short switching times. These short switching times are further favoured in that with several inventive assemblies arranged adjacent to one another, the capacitor arrangements and low line inductances of an assembly contribute in preventing any interference pulses of neighbouring assemblies.

The contact layers may have a common covering zone in which they are separated from one another by an insulation. Preferably, the two contact layers have contact areas each which are spaced from one another essentially in the direction of the longitudinal extension of the power supply buses. Further, the two power supply buses may be arranged essentially parallel to one another.

The semiconductor switches which are arranged between the two power supply buses may be arranged on a substrate which is preferably adapted for contact making with a cooling device.

The power output may comprise a busbar which is arranged between the two power supply buses.

In a preferred embodiment the semiconductor switches are formed by high-speed switching low-loss field effect transistors (FETs) or by high-speed switching low-loss bipolar transistors with insulated gate terminals (IGBTs). In particular, MOSFETs with integrated free-wheeling diodes or with additional external free-wheeling diodes which are connected in parallel with the transistors may be employed. These external free-wheeling diodes are preferably arranged in the same manner as the semiconductor switches and in their immediate vicinity at one of the conductor rails.

The two power supply buses and the busbar may be mechanically firmly connected with each other by an electrically insulating circuit board or the substrate. Alternatively, the power supply buses and the busbar may be mechanically firmly connected with each other by electrically insulating lands which are arranged between the individual buses. The circuit board or the substrate may also serve to accommodate printed conductors for supplying control signals to the semiconductors or for accommodating further active or passive components, or for bringing out test or measuring points from the assembly. The circuit board or the substrate, respectively, may also serve to accommodate connecting lines between the respective control inputs of the semiconductor switches and the terminal for the connection with the driving means.

If the arrangement comprises a circuit board this may be provided with recesses which are dimensioned in such a manner that the semiconductors (transistors and diodes) which are directly applied on the conductor rails or the substrate are exposed at least with their contact areas, i.e. that they are not covered by the circuit board. This brings about that the effective height of the semiconductors and the circuit board do not add up. Rather, they are connected with the conductor rails at least with some of their connection points directly and on the same level. The circuit board thus serves both for the mechanical connection of the conductor rails with each other and for the electric line routing.

The connection of the printed conductors arranged on the circuit board or the substrate, or the power supply buses or the busbar, respectively, with the contact making points of the semiconductors is made by plane contact sheets which are angled, if required, for a height compensation or a lateral compensation, or by contact straps made from sheet metal. The contact sheets or straps are soldered or welded to the printed conductors or the power supply buses, respectively, or the busbar, on the one hand, and the contact making points of the semiconductors, on the other hand. In the case of the semiconductors, in particular those with large plane contact making points are used which have a coating of noble metal (preferably gold or silver-palladium, or the like).

Contrary to other connecting techniques such as bonding, this approach involves lower stresses on the individual semiconductors and is less susceptible to failures so that a lower reject rate is achievable. Moreover, the contact sheets may be designed so as to be more space saving and low-resistance. Insofar, this connecting technique contributes in a synergistic manner to the overall concept for providing an electronic assembly for switching electric power, which may be manufactured economically and is of compact construction. The contact sheets which are configured in this manner also prevent the interfering inductive coatings in the connections between the printed conductors or the power supply bars, respectively, or the busbar, on the one hand, and the contact making points of the semiconductors, on the other hand. Nevertheless, this type of connection in an electronic assembly may also be employed independent of the above described concept of the power supply to an electronic assembly. Moreover, the connection between the two ends of the contacts sheets can be achieved here in a single soldering operation, while in bonding a plurality of individual bonding wires have to be joined at both of their ends with the respective contact making point.

In a preferred embodiment of the invention the electrically insulating circuit board or the foil carries current-limiting resistors in the control lines for the semiconductor switches, with these (gate) resistors being provided between the respective control inputs and the terminal for the connection with the driving means.

The electronic assembly may comprise at least two semiconductor switches which are connected in series under the formation of a half-bridge. Each of the semiconductor switches has a control input for the connection with a driving means. The first semiconductor switch has to be connected with its source terminal to a high voltage potential.

The second semiconductor switch has to be connected with its drain terminal to a low voltage potential.

For forming an output, the drain terminal of each first semiconductor switch is connected with the source terminal of the respective second semiconductor switch. At least one capacitor arrangement is arranged between the high and the low voltage potential.

Respective first semiconductor switches are connected with their source terminal to a common first metallic conductor rail which is to be connected with the high voltage potential. Respective second semiconductor switches are connected with their source terminal to a common second metallic conductor rail which forms the output, with the second conductor rail being arranged spaced from and adjacent to the first conductor rail. Each second semiconductor switch is connected with its drain terminal to a common third metallic conductor rail which is to be connected with the low voltage potential and which is arranged spaced from and adjacent to the first and second conductor rail.

The capacitor arrangement comprises a back-up capacitor which is connected with the first and the third conductor rail via terminals, which encompasses the first and the second semiconductor switch in such a manner that the semiconductor switches are located spatially between the corresponding conductor rails and the back-up capacitor. The control input has a terminal for the connection with the driving means in the area of a first face of the conductor rails, and the output has a terminal for the connection with an electric load in the area of a second face of the second conductor rail, which is located opposite the first face.

The invention also relates to a power output stage of a driving means for a multiphase electrical machine in which one electronic assembly with the above characteristics is used for each phase, with the electronic assemblies being arranged at least along a portion of the circumference of the electrical machine.

Further characteristics, properties, advantages, and possible modifications will become apparent for those with skill in the art from the following description which refers to the accompanying drawing.

BRIEF DESCRIPTION OF THE DRAWING

FIG. 2 illustrates a schematic cross-sectional view of an inventive electronic assembly.

FIG. 3 illustrates a schematic plan view of an inventive electronic assembly according to FIG. 2.

FIG. 4 illustrates a schematic plan view of several inventive electronic assemblies according to FIG. 2 or FIG. 3, respectively, which are connected together.

DETAILED DESCRIPTION OF THE DRAWING

Figure 1:
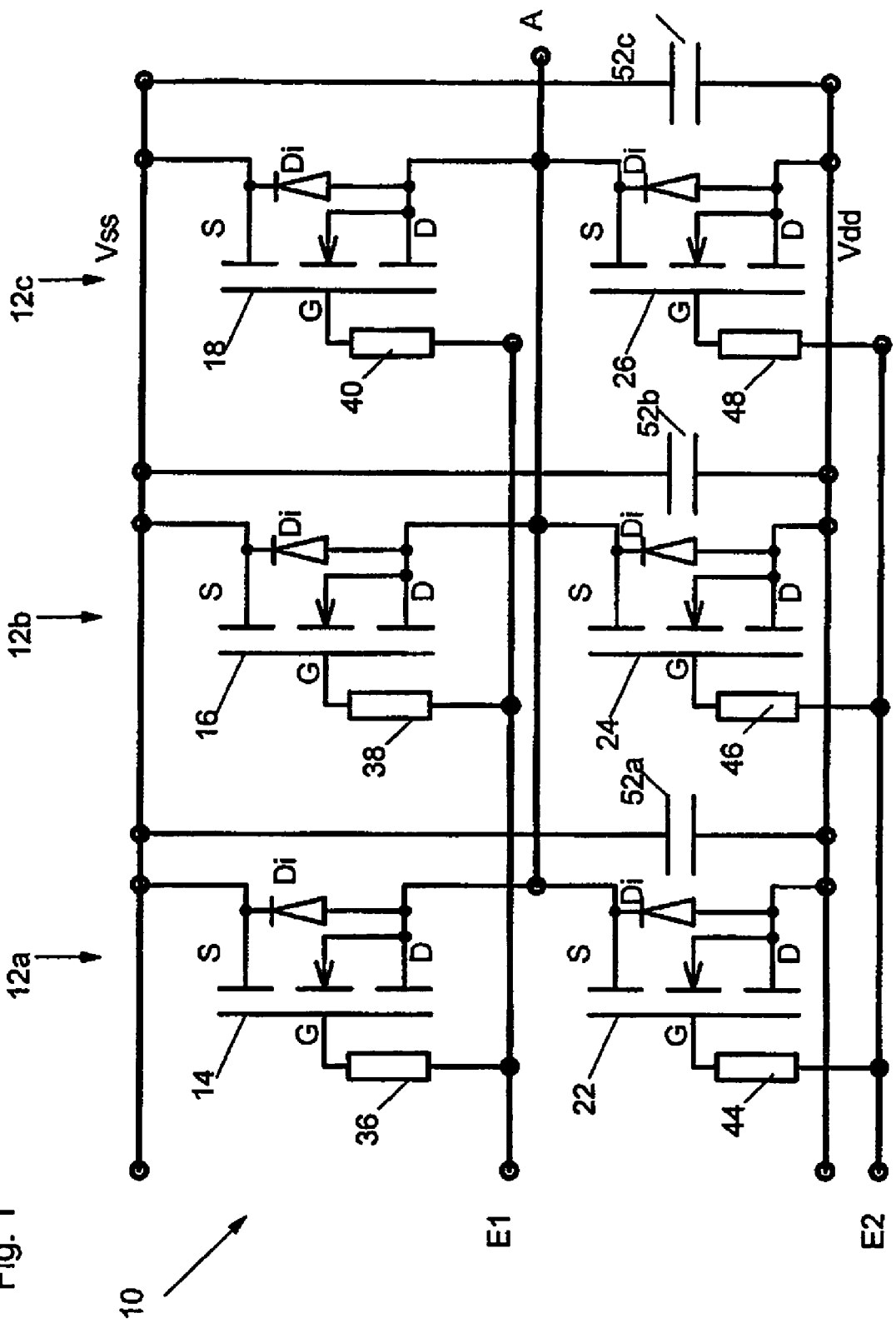
FIG. 1 illustrates a schematic circuit diagram of an electronic assembly which embodies the invention.

The inventive electronic assembly illustrated in FIG. 1 is a half-bridge circuit 10 which comprises three pairs 12a, 12b, 12c of N-channel MOSFETs connected in parallel, each of which acting as a semiconductor switch. Two each of the MOSFETs 14, 22; 16, 24; 18, 26 which form one pair each are connected in series. The first MOSFET 14; 16; 18 of each pair with its source terminal S lies on a high voltage potential $V_{SS}$, and each second MOSFET 22; 24; 26 of each pair with its drain terminal D lies on a low potential $V_{DD}$. For the formation of an output A the drain terminal of each of the first MOSFETs 14; 16; 18 and the source terminal of each of the second MOSFETs 22; 24; 26 are connected with each other.

One control input each E1; E2 is provided for the group of the first MOSFETs 14; 16; 18 or the group of the second MOSFETs 22; 24; 26, respectively, with the gate terminals G of the respective MOSFETs being driven via gate resistors 36; 38; 40 or 44; 46; 48, respectively. Each of the semiconductor switches which are configured as MOSFETs has a freewheeling diode Di between its power terminals D, S, which as a so-called "body diode" is formed integrated with the respective semiconductor switch on the same semiconductor element. Incidentally, separately provided diodes adjacent to the MOSFETs would also be arranged at the or adjacent to the first or second, respectively, conductor rail.

Between the high and the low voltage potential $V_{SS}$ and $V_{DD}$ a back-up capacitor arrangement is arranged which is formed by individual back-up capacitors 52a, 52b, 52c which are connected in parallel. The configuration of the capacitor arrangement 52a, 52b, 52c is described in more detail further below. The respective MOSFET group is driven by a (pulse width modulated) control signal with a switching frequency of up to more than 100 kHz.

As shown in FIG. 2, the first MOSFETs 14; 16; 18 are electrically connected with the source terminal S to a common first metallic conductor rail 60 which is to be connected with the high voltage potential $V_{SS}$. The cross-section of the conductor rail 60 is approximately L-shaped, and it is made from copper or a similar material with good current and heat conductivity. The horizontal portion of the conductor rail 60, illustrated in FIG. 2, may also be realised by a correspondingly shaped contact pad on the substrate, for contacting the conductor rail 60 which in this case is rectangular with the source terminal S of the MOSFET 14 via a soldered joint.

The second MOSFETs 22; 24; 26 are electrically connected with their source terminal (S) to a common second metallic conductor rail 62 which forms the output A, with the second conductor rail 62 being arranged spaced from the first conductor rail 60 and adjacent to it. The second conductor rail 62, too, has a cross-section of approximately rectangular or L-shape and is made from the same material as the first conductor rail 60.

The second MOSFETs 22; 24; 26 with their drain terminals D each are connected with one or several connector plates or connector lands 80 which serve as contact plates to a common third metallic conductor rail 66 which is to be connected with the low voltage potential $V_{DD}$, with the third conductor rail 66 being arranged spaced from the second conductor rail 62 and adjacent to it.

The first MOSFETs 14; 16; 18 are connected in a similar manner as the second MOSFETs with their respective drain terminals D to the second conductor rail 62 via one or several connector plates or connector lands 82 which serve as contact plates.

The capacitor arrangement 52 is soldered or welded to the first and third conductor rail to form block-shaped foil capacitors 52a . . . 52c. The foil capacitors 52a . . . 52c are arranged adjacent to one another along the conductor rails. The foil capacitors encompass the respective first and second semiconductor switches in such a manner that the semiconductor switches are spatially located between the corresponding conductor rails and the respective foil capacitor.

Figure 2A:
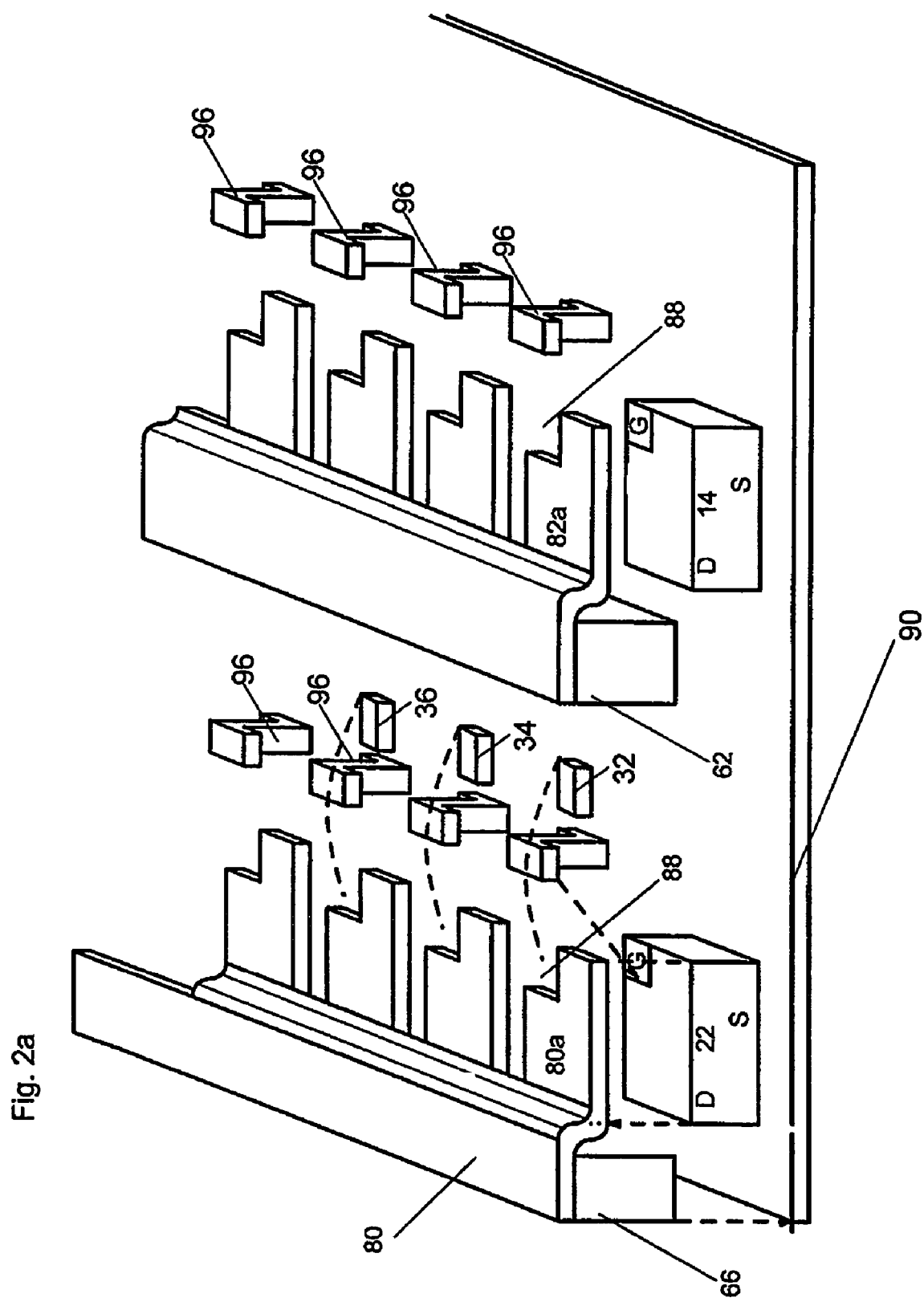
FIG. 2a illustrates a partially schematic perspective exploded view from FIG. 2.

FIG. 2a shows the connector plates 80, 82 which are soldered or welded to the conductor rails 62, 66. For compensating the height difference between the top of the conductor rails and the semiconductor switches the connector plates 80, 82 are cranked. For each of the semiconductor switches 14 . . . , 22 . . . contact tags 80a, 82a are provided which at their free ends each have a lateral recess 88. A Z-shaped bent connection 96 to the gate terminal G of the semiconductor switches 14 . . . , 22 . . . extends into these recesses 88. The connection 96 provides a line to the gate resistors 36; 38; 40 or 44; 46; 48, respectively, which are also arranged on the circuit board 90 (see FIG. 1 or FIG. 2a, respectively) and which are formed as SMD (surface mounted device) components. This line, too, between the gate resistors and the control inputs G of the MOSFETs is realised by soldering or welding the connections 96 to the control inputs G of the MOSFETs or the circuit board 90, respectively.

Because FIG. 2a is a partially exploded view the broken-line arrows indicate the position of the individual components in their assembled condition. For the sake of clarity, not all components of the electronic assembly are illustrated. In particular, the layout of the printed conductors on the substrate 90 is not illustrated in detail.

The semiconductor switches arranged between the two power supply buses are disposed on a substrate 90 which is provided with cooling rips 90' for contact making with a cooling device, for example, a fluid cooling means.

Contact layers 100, 102 made from copper sheet or a material with similar good conductivity properties are soldered or welded to the top of the two outer conductor rails 60, 66 (see FIG. 2) which serve as power supply buses. These contact layers 100, 102 encompass the respective side surfaces 52' and 52" of the capacitor arrangement 52a . . . 52c. Each of the contact layer 100, 102 has free end portions 100', 102' which mutually project one another towards the respective other one of the power supply buses (see FIG. 2). The two contact layers 100, 102 have a common covering zone 110 in which they are separated from one another by an insulating layer 112.

As illustrated in FIG. 3, the two contact layers 100, 102 have an essentially rectangular contact area 120, 122 each in the area of the ends of the electronic assembly, which is freely accessible (from above) and adapted for contact making with correspondingly designed power terminals and spaced in the direction of the longitudinal extension of the power supply buses. For the purpose of rendering the contact layer 102 which is situated closer to the surface of the capacitor arrangement 52a . . . 52c accessible for the corresponding power terminal, the insulating layer 112 and the contact layer 100 above it are correspondingly shortened.

The area which is accessible from the outside (from above) between the two contact layers 120, 122 is covered by the folded-back insulating layer 112 (see FIG. 2 or 3, respectively).

In order to provide a unit of a half-bridge assembly which may be manufactured and handled separately, the first, second, and third conductor rail 60, 62, 66 are mechanically firmly connected with each other by an electrically insulating circuit board 90. For this purpose, the circuit board 90 is firmly connected with the conductor rails.

As can be seen from FIG. 3, the respective control inputs E1, E2 to connecting lines between the respective control inputs G of the semiconductor switches as well as some test pins at a connecting strip 76 at the circuit board 90 are brought out in the area of a first face 78 (FIG. 3 bottom) of the conductor rails 60, 62, 66 for the connection with a driving means, while the output A is brought out to a terminal 94 for the connection with an electric load in the area of a second face 92 of the second conductor rail 62, opposite the first face (FIG. 3 top).

FIG. 4 shows a plan view in which several inventive electronic assemblies 10 according to FIG. 2 or FIG. 3, respectively, are connected together. These electronic assemblies 10 which are connected together in this manner and are supplied with electric power via feeders Vss and Vdd, may be arranged along the circumference of a multiphase electrical machine, with one electronic assembly 10 being used for each phase of the electrical machine.

The invention claimed is:

1. An electronic assembly for switching electric power, comprising
   two power supply buses spaced from each other between which semiconductor switches to be driven by means of a control input are arranged at a power output, for providing electric power,
   a capacitor arrangement bridging the two power supply buses, which extends at least partially over the length of the power supply buses, two contact layers originating from one each of the power supply buses and covering the capacitor arrangement at least partially, with the contact layers comprising free end portions which mutually project one another towards the respective other one of the power supply buses, with the two contact layers having a freely accessible contact area each which is adapted for contact making with correspondingly configured power terminals, and with the power output comprising a busbar which is arranged between the two power supply buses.

2. The electronic assembly according to claim 1, with the two contact layers having a common covering zone in which they are separated from one another by an insulation.

3. The electronic assembly according to claim 1, with the two contact layers having contact areas each which are spaced from one another essentially in the direction of the longitudinal extension of the power supply buses.

4. The electronic assembly according to claim 1, with the two power supply buses being arranged essentially parallel to one another.

5. The electronic assembly according to claim 1, with the semiconductor switches which are arranged between the two power supply buses being arranged on a substrate which is adapted for contact making with a cooling device.

6. The electronic assembly according to claim 1, with the semiconductor switches being formed by high-speed switching low-loss field effect transistors (FETs) or by high-speed switching low-loss bipolar transistors with insulated gate terminals (IGBTs) with, in particular, MOSFETs with integrated free-wheeling diodes or with additional external free-wheeling diodes which are connected in parallel with the transistors being employed.

7. The electronic assembly according to claim 1, with plane contact sheets which are angled for a height compensation or a lateral compensation being soldered or welded as electrical connection between the printed conductors arranged on the circuit board or the substrate, or the power supply buses or the busbar, respectively, one the one hand, and contact making points of the semiconductors, on the other hand.

8. The electronic assembly according to claim 1, with at least two semiconductor switches (14, 22; 24, 18, 26) which are connected in series under the formation of a half-bridge (12a, 12c, 12c);

each of the semiconductor switches (14, 22; 24, 18, 26) having a control input (G) for the connection with a driving means;

the first semiconductor switch (14, 16, 18) to be connected with its source terminal (S) to a high voltage potential ($V_{ss}$);

the second semiconductor switch (22, 24, 26) to be connected with its drain terminal (D) to a low voltage potential ($V_{DD}$);

for forming an output (A), the drain terminal (D) of each first semiconductor switch (14, 16, 18) being connected with the source terminal (S) of the respective second semiconductor switch (22, 24, 26); and at least one capacitor arrangement (52) being arranged between the high and the low voltage potential ($V_{ss}$, $V_{DD}$);

respective first semiconductor switches (14, 16, 18) being arranged with their source terminal (S) on a common first metallic conductor rail (60) to be connected with the high voltage potential ($V_{ss}$);

respective second semiconductor switches (22, 24, 26) being arranged with their source terminal (S) a common second metallic conductor rail (62) which forms the output (A), with the second conductor rail (62) being arranged spaced from and adjacent to the first conductor rail (60);

each second semiconductor switch (22, 24, 26) being connected with its drain terminal (D) to a common third metallic conductor rail (66) which is to be connected with the low voltage potential ($V_{DD}$) being arranged spaced from and adjacent to the first and second conductor rail (60, 62);

the capacitor arrangement (52) comprising a back-up capacitor (52a, . . . , 52d) which is connected with the first and the third conductor rail (60, 66) via terminals, which encompasses the first and the second semiconductor switches (14, 22; 24, 18, 26; 20, 28) in such a manner that the semiconductor switches are located spatially between the corresponding conductor rails (60, 66) and the back-up capacitor (52a, . . . , 52d);

the control input (G) comprising a terminal (76) for the connection with the driving means in the area of a first face (78) of the conductor rails (60, 62, 68), and the output (A) comprising a terminal for the connection with an electric load in the area of a second face (82) of the second conductor rail (62), which is located opposite the first face.

9. A power output stage of a driving means for a multiphase electrical machine, characterised in that at least one electronic assembly according to claim 1 is provided for each phase of the electrical machine, with the electronic assembly being arranged at least along a portion of the circumference of the electrical machine.

10. The electronic assembly according to claim 7, with the semiconductors having large plane contact making points with a coating of noble metal.

11. The electronic assembly according to claim 8, with the three rails (60, 62, 66) being mechanically firmly connected with each other by an electrically insulating circuit board (90).

12. The electronic assembly according to claim 8, with the three rails (60, 62, 66) being mechanically firmly connected with each other by electrically insulating lands which are arranged between the individual conductor rails.

* * * * *